US010756159B2

(12) United States Patent
Gu et al.

(10) Patent No.: US 10,756,159 B2
(45) Date of Patent: Aug. 25, 2020

(54) DISPLAY PANEL AND DISPLAY DEVICE

(71) Applicant: Xiamen Tianma Micro-Electronics Co., Ltd., Xiamen (CN)

(72) Inventors: Jiachang Gu, Wuhan (CN); Shanfu Yuan, Wuhan (CN); Tao Peng, Wuhan (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/502,252

(22) Filed: Jul. 3, 2019

(65) Prior Publication Data

US 2020/0212156 A1 Jul. 2, 2020

(30) Foreign Application Priority Data

Dec. 27, 2018 (CN) .......................... 2018 1 1609368

(51) Int. Cl.
*H01L 27/00* (2006.01)
*H01L 27/32* (2006.01)
(Continued)

(52) U.S. Cl.
CPC .......... *H01L 27/3276* (2013.01); *G09G 3/20* (2013.01); *H01L 27/3246* (2013.01); *H01L 27/3262* (2013.01); *H01L 27/3265* (2013.01)

(58) Field of Classification Search
CPC ............. H01L 27/3276; H01L 27/3246; H01L 27/3262; H01L 27/3265; H01L 27/124;
(Continued)

(56) References Cited

U.S. PATENT DOCUMENTS 7,642,109 B2 * 1/2010 Winters .............. H01L 51/5228
257/E51.001
2005/0179374 A1 * 8/2005 Kwak ................. H01L 51/5228
313/506
(Continued)

FOREIGN PATENT DOCUMENTS

CN 104282724 A 1/2015
CN 105739154 A 7/2016
(Continued)

*Primary Examiner* — Nikolay K Yushin
(74) *Attorney, Agent, or Firm* — Anova Law Group PLLC

(57) ABSTRACT

Display panel and display device are provided. The display panel includes a notch region, a display region, a frame region surrounding the display region, and a first base plate. The frame region includes a first frame region and a second frame region opposite to each other. A portion of the first frame region recesses toward the display region to form the notch region. The first base plate includes an anode power bus, an anode power connection part, and anode power connection wires. The anode power wires are disposed in the display region and include first anode power wires extending along a second direction perpendicular to the first direction. At least a portion of the anode power bus is disposed in the first frame region. The anode power connection part includes a first anode power connection part to connect the anode power bus to the first anode power wires.

14 Claims, 17 Drawing Sheets

(51) Int. Cl.
*G09G 3/20* (2006.01)
*G09G 3/00* (2006.01)

(58) Field of Classification Search
CPC ....... H01L 27/1255; H01L 27/06; G09G 3/20;
G09G 3/3677; G09G 3/4342; G09G
3/3655; G09G 3/3266; G09G 3/3688;
G09G 3/3648; G09G 3/2022
See application file for complete search history.

(56) References Cited

U.S. PATENT DOCUMENTS

2007/0048886 A1* 3/2007 Winters .............. H01L 51/5228
438/29
2019/0296098 A1* 9/2019 Cheng ................. H01L 51/5237
2020/0021016 A1* 1/2020 Son ......................... H01Q 1/38

FOREIGN PATENT DOCUMENTS

| CN | 107293567 A | 10/2017 |
| CN | 107910352 A | 4/2018 |
| CN | 107993581 A | 5/2018 |
| CN | 108011051 A | 5/2018 |
| CN | 108877622 A | 11/2018 |

\* cited by examiner

DISPLAY PANEL AND DISPLAY DEVICE

CROSS-REFERENCES TO RELATED APPLICATION

This application claims the priority of Chinese Patent Application No. 201811609368.2, filed on Dec. 27, 2018, the content of which is incorporated herein by reference in its entirety.

TECHNICAL FIELD

The present disclosure generally relates to the field of display technology and, more particularly, relates to a display panel and a display device.

BACKGROUND

Electronic devices with display panels have spread to all aspects of life and work. In various types of electronic devices, especially in mobile terminal products, frames are continuously compressed in designs of frames in display panels to achieve a high screen ratio and to meet users' requirements for display regions. Present technologies propose some irregularly-shaped display panels. For example, full-screen display panels with notches become a mainstream of current irregularly-shaped display panels. However, the notches in the display panels may reduce the display performance of the display panels.

There is a need to provide a display panel and a display device to improve the display performance of the display panel with the notches.

SUMMARY

One aspect of the present disclosure provides a display panel. The display panel includes a notch region, a display region, a frame region surrounding the display region, and a first base plate. The frame region includes a first frame region and a second frame region opposite to each other along a first direction. A portion of the first frame region recesses toward the display region to form the notch. The first base plate includes an anode power bus, an anode power connection part, and a plurality of anode power wires. The plurality of anode power wires is disposed in the display region and includes first anode power wires extending along a second direction perpendicular to the first direction. At least a portion of the anode power bus is disposed in the first frame region. The anode power connection part at least includes a first anode power connection part to connect the anode power bus to the first anode power wires.

Another aspect of the present disclosure provides a display device including the display panel described above.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
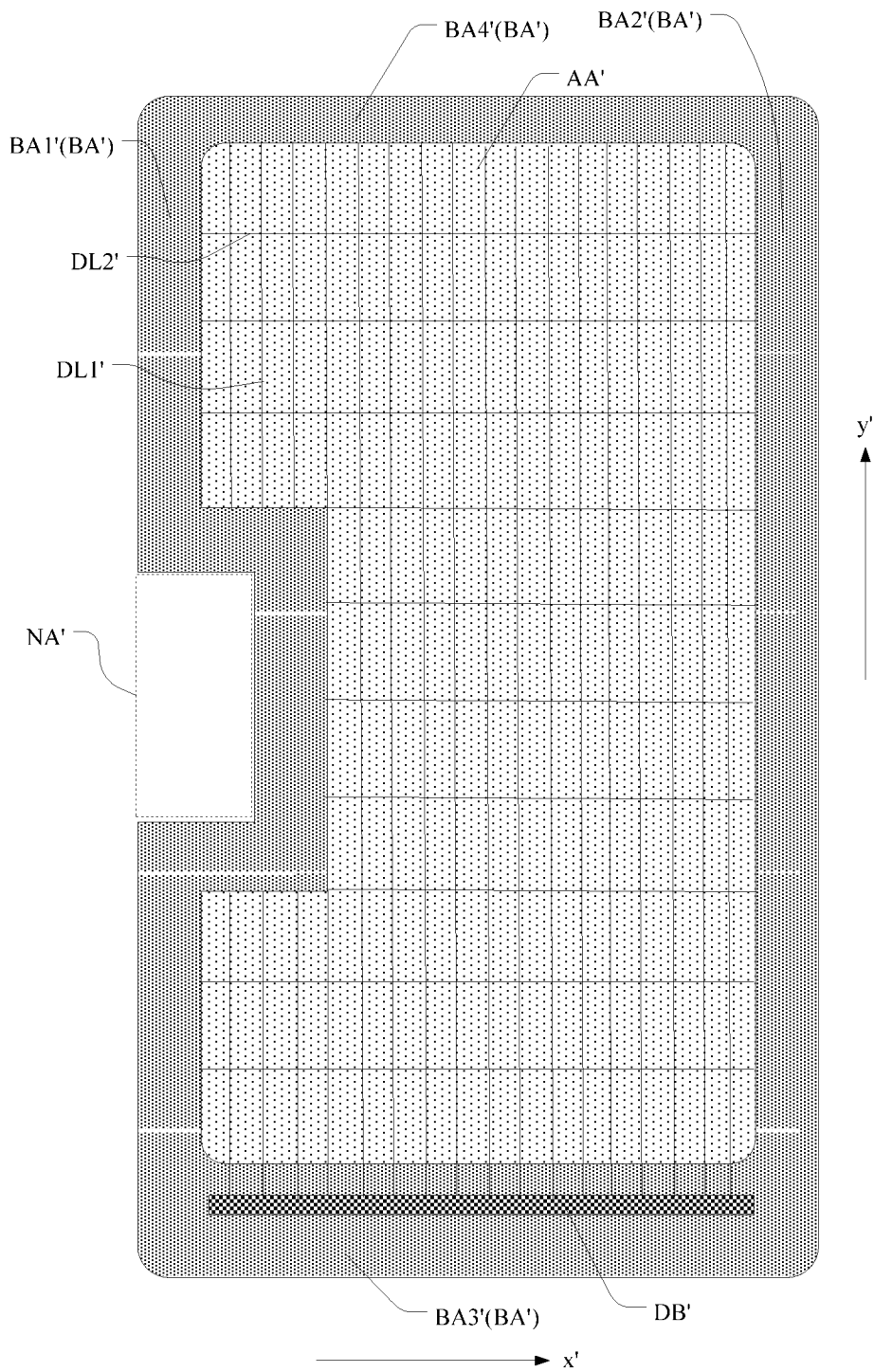
FIG. 1 illustrates a display panel.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

FIG. 1 illustrates an exemplary display panel in the current technology. As illustrated in FIG. 1, the display panel may include a notch region NA', a display region AA' and a frame region BA' surrounding the display region AA'. The frame region BA'1 may include a first frame region BA1', a second frame region BA2', a third frame region BA3', and a fourth frame region BA4'. The first frame region BA1' and the second frame region BA2' may oppose each other along a first direction x'. The third frame region BA3' and the fourth frame region BA4' may oppose each other along a second direction y'. A portion of the first frame region BA1' may recess toward the display region AA', to form the notch region NA'. First power signal wires DL1' and second power signal wires DL2' may be disposed in the display region AA' to form a power grid. Power signals may be transmitted to the power grid through a power bus DB' disposed in the third frame region BA3'.

After forming the notch region NA', a gap may appear in the power grid at a position corresponding to the notch region NA'. Along the first direction x', a first portion of the power grid close to the notch region NA' may have a resistance larger than a resistance of a second portion of the power grid close to the second frame region BA2' and away from the notch region NA'. A difference between the resistance of two portions of the power grid along the first direction x', and then a difference between the power signals of two portions of the power grid along the first direction x' may be large. A difference between the power signals of two portions of the power grid along the second direction y' may be large, too. A display performance of the display panel may be affected.

The present disclosure provides a display panel and a display device. The display panel may include a notch region and an anode power bus may be at least disposed at a side of the frame region close to the notch region. An anode power connection part may connect anode power wires to the anode power bus. In the present disclosure, anode power signals may be provided to a portion of the anode power wires close to the notch region, and a resistance difference in the anode power wires in the display panel because of a broken of the anode power wires in the position of the notch region may be compensated. A uniformity of the anode power signals in the display panel and then a display performance of the display panel may be improved.

Figure 2:
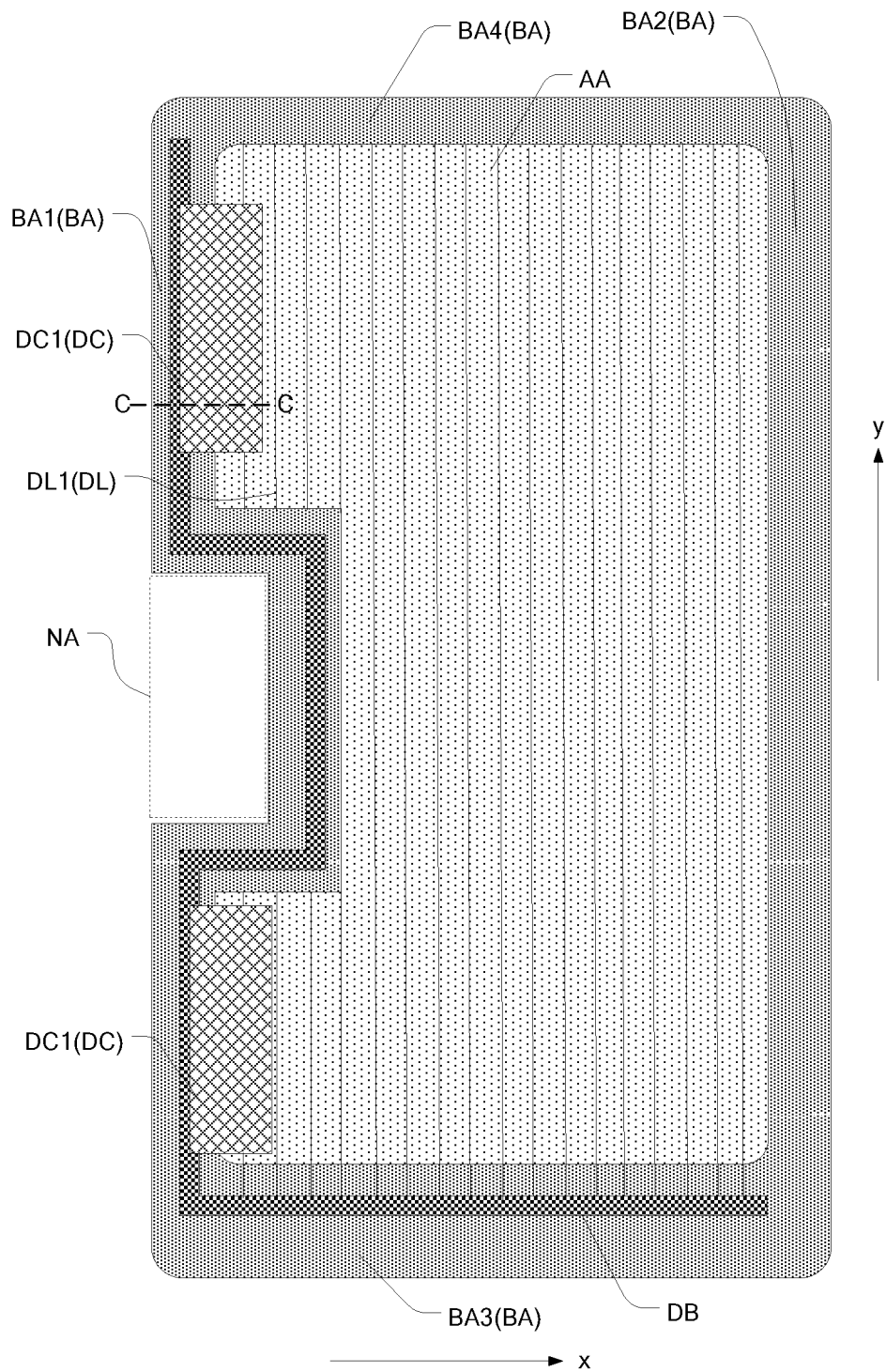
FIG. 2 illustrates an exemplary display panel consistent with various disclosed embodiments in the present disclosure.
Figure 3:
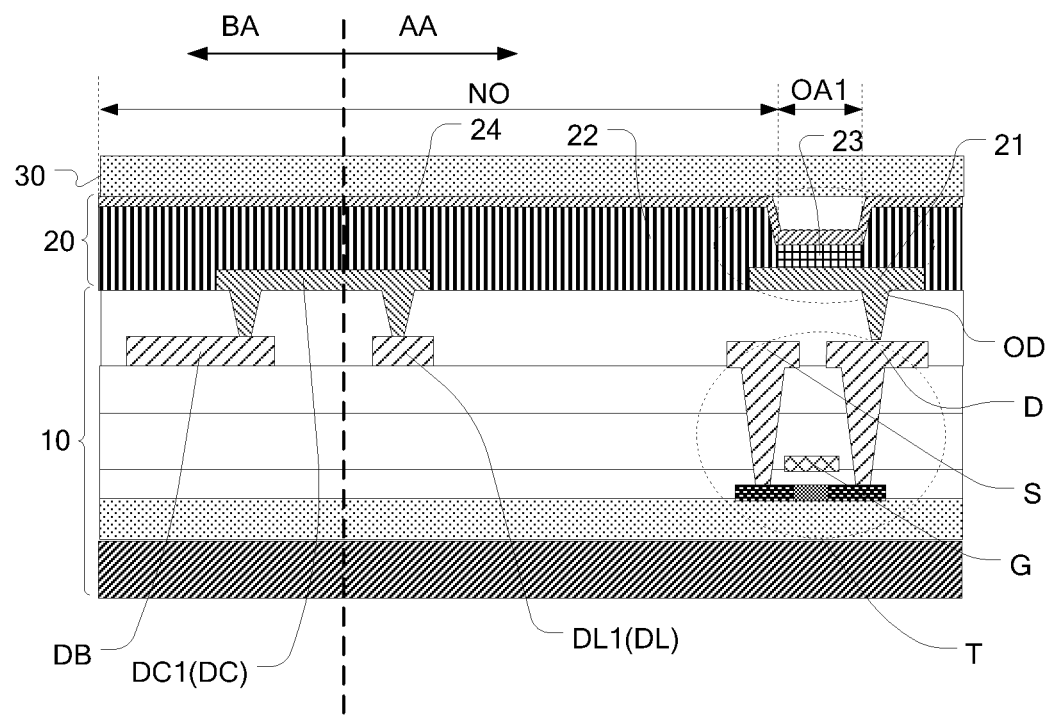
FIG. 3 illustrates a structure of film layers for an exemplary display panel consistent with various disclosed embodiments in the present disclosure.
Figure 4:
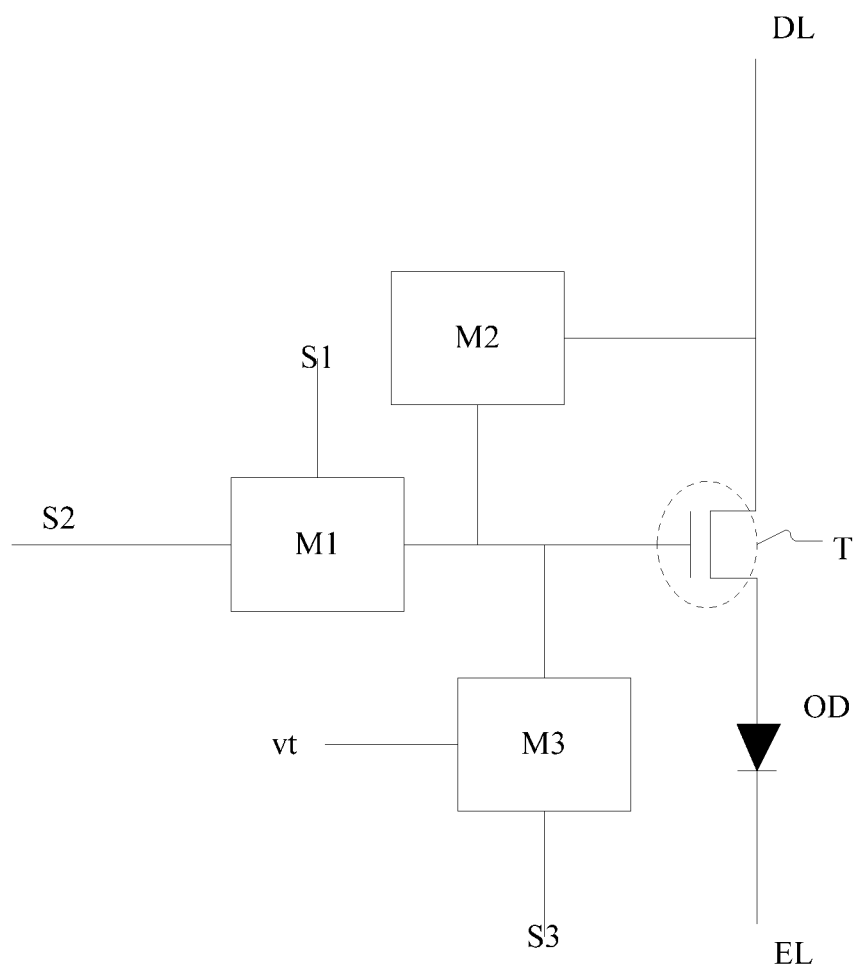
FIG. 4 illustrates a pixel circuit structure of an exemplary display panel consistent with various disclosed embodiments in the present disclosure.

FIG. 2 illustrates an exemplary display panel provided by one embodiment of the present disclosure, FIG. 3 illustrates a structure of film layers for the display panel, and FIG. 4 illustrates a pixel circuit structure of the display panel. FIG. 3 is a cross-section view of the display panel in FIG. 2 along a C-C direction. In one embodiment illustrated in FIGS. 2-4, the display model may include a notch region NA, a display region AA, and a frame region BA surrounding the display region AA. The frame region BA may include a first frame region BA1, a second frame region BA2, a third frame region BA3, and a fourth frame region BA4. The first frame region BA1 and the second frame region BA2 may oppose each other along a first direction x. The third frame region BA3 and the fourth frame region BA4 may oppose each other along a second direction y. The first direction x and the second direction y may be perpendicular to each other. A portion of the first frame region BA1 may recess toward the display region AA to form the notch region NA. The frame region BA may be bonded to integrated circuit chips or to flexible circuit boards with integrated circuit chips. The integrated circuit chips may provide various types of signals to the display panel.

The display panel may further include a first base plate 10, a second base plate 30 opposite to the first base plate 10, and a light-emitting layer 20 between the first base plate 10 and the second base plate 30.

The light-emitting layer 20 may include an anode 21, a pixel definition layer 22, a light-emitting material 23, and a cathode 24. The anode 21 may be disposed at one side of the first panel, and the pixel definition layer 22 may be disposed at a side of the anode 21 away from the first base plate 10. The pixel definition layer 22 may include first opening regions OA1 and a non-opening area NO. The first opening regions OA1 may expose the anode 21. The light-emitting material 23 may be disposed inside the first opening regions OA1, and the cathode 24 may be disposed at a side of the light-emitting material 23 and the pixel definition layer 22 away from the anode 21. At a position corresponding to each first opening region OA1, the anode 21, the cathode 24, and the light emitting material 24 between the anode 21 and the cathode 24 may form a light-emitting device OD. Light-emitting devices OD in the display panel may emit light with different brightness to display images.

The first base plate 10 may be an array plate. The array plate may include pixel circuits and signal wires for transmitting signals to the pixel circuits. Each pixel circuit of the display panel may include a data writing module M1, a holding module M2, a control module M3, and a driving transistor T. The driving transistor T may be a thin film transistor including a gate G, a source S, and a drain D. The data writing module M1, the holding module M2, and the control module M3 may include one or more thin film transistors respectively. The structure of the data writing module M1, the holding module M2, and the control module M3 may be referred to descriptions in the current technology.

Signals wires in the first base plate 10 to transmit signals to the pixel circuits may include scanning wires S1, data wires S2, control wires S3, anode power wires DL, and cathode power wires EL. In a pixel circuit of a light-emitting device OD, a scanning wire S1 and a data wire S2 may be electrically connected to the data writing module M1, and the driving transistor T may be electrically connected to the light-emitting device OD. In a cut-off stage, a control terminal of the control module M3 may receive control signals from the corresponding control wire S3. The control module M3 may be turned on and cut-off signals vt input to an input terminal of the control module M3 may be transmitted to the gate G of the corresponding driving transistor T to make the corresponding driving transistor T operate in a completely cut-off region. Then the control module M3 may be turned off according to a control signal input to the control terminal of the control module M3, and the scanning wire S1 may transmit scanning driving signals to the control terminal of the data write module M1. The data writing module M1 may be turned on. The data wire S2 may transmit data driving signals to the gate G of the driving transistor T, and the source S of the driving transistor T may receive anode power signals from the anode power wire DL. The anode 21 of the light-emitting device OD may be connected to the drain D of the driving transistor T, and the cathode 24 of the light-emitting device OD may be connected to the cathode power wire EL. The driving transistor T may output driving currents according to the data signals input to the gate G of the driving transistor T. The driving currents may drive the light-emitting device OD to luminate and display. Simultaneously, the holding module M2 may keep the gate voltage of the driving transistor T, and the driving transistor T may output the driving currents continuously to make the light-emitting device OD luminating continuously. If a voltage drop of the anode power signals at different positions in the display panel has a large difference, the driving transistors T at different positions may output the driving currents with different amplitude although the data signals input to the gates G of the driving transistors T at different positions are same. Correspondingly, the light-emitting devices OD at different positions may emit light with different intensity based on the same data signals, and the display performance of the display panel may be interfered.

The anode power wires DL for providing the anode power signals to the pixel circuits may be disposed in the display region AA, and may include first anode power wires DL1 extending along the second direction y. A portion of the first anode power wires DL1 may break at the notch region NA. The first base plate 10 may further include an anode power bus DB and anode power connection parts DC. The frame region BA which is self-bonded with the integrated circuit chips may receive the anode power signals from the integrated circuit chips through the anode power bus DB, and the anode power bus DB may transmit the anode power signals to the anode power wires DL through the anode power connection part DC. The anode power signals may be further transmitted to the pixel circuits (not shown in the figure) through the anode power wires DL.

In one embodiment, the integrated circuit chips may be bonded in the third frame region BA3, and the anode power bus DB may at least extend from the third frame region BA3 into the first frame region BA1. The anode power connection part DC may at least include a first anode power connection part DC1. The first anode power connection part DC1 may be connected to the anode power bus DB in the first frame region BA1 and may extend from the first frame region BA1 into the display region AA to connect the first anode power wires DL1 in the display region AA. In the first frame region BA1 at a side of the display panel where the notch region NA is disposed, the anode power bus DB may transmit the anode power signals to the first anode power wires DL1 through the first anode power connection part DC1. When the anode power signals are transmitted from the anode power bus DB to the first anode power wires DL1 in the first frame region BA1 at a side of the display panel where the notch region NA is disposed, the anode power bus DB may have a large width and a consumed load may be small. A voltage drop of the anode power signals after arriving the first anode power wires DL1 may be small. Simultaneously, a first path of the anode power signals transmitted from a first portion of the anode power bus DB in the first frame region BA1 at a side of the display panel close to the notch region NA into the display region AA, and a second path of the anode power signals transmitted from a second portion of the anode power bus DB in the third frame region BA3 into the display region AA, may form a parallel channel. A resistance of the path of the anode power signals close to the notch region NA may be suppressed. Then an increment of the resistance due to a portion of the first anode power wires DL1 broken at the notch region NA may be compensated partially. A balance of the resistance of the anode power wires DL in the display panel, and a uniformity of the anode power signals in the display panel, may be improved.

The anode power wires DL, the anode power bus DB and the anode power connection part DC may be disposed in a same film layer of the display panel, or in film layers different from the display panel. For example, in one embodiment illustrated in FIG. 3, the anode power wires DL and the anode power bus DB may be disposed in a layer same as the source S and the drain D, while the anode power connection part DC may be disposed in a layer same as the anode 21. For description purposes only, the embodiment illustrated in FIG. 3 is used as an example to describe the present disclosure and it should not limit the scopes of the present disclosure. In one embodiment, as illustrated in FIGS. 2-4, the anode power bus DB and the first anode power wires DL1 may be disposed in a layer same as the source S and the drain D in the driving transistor T, and the anode power connection part DC may be disposed in a layer same as the anode 21. A plurality of conductive layers may be disposed in the first base plate 10 to form devices of the pixel circuits and signal wires. A conductive layer where the source S and the drain D are disposed may be made of a metal film layer with a titanium-aluminum-titanium structure. The metal film layer of the source S and the drain D may have a small resistance. Then the anode power bus DB and the first anode power wires DL1 disposed in the metal film layer of the source S and the drain D, and may be made of a material same as the metal film layer. A difference of a voltage drop of the anode power signals on the first anode power wires DL1 and a voltage drop of the anode power signals on the anode power bus DB may be smaller compared with to a material with a large resistance. A uniformity of the anode power signals in the display panel, may be improved further. The anode power connection part DC connecting the anode power bus DB to the first anode power wires DL1 may be disposed in a layer same as the anode 21. A conductive film layer where the anode 21 is disposed may be utilized effectively. Along a thickness direction of the display panel, through holes may be formed at overlapping positions between the anode power connection part DC and the anode power bus DB, to connect the anode power connection part DC and the anode power bus DB. Through holes may also be formed at overlapping positions between the anode power connection part DC and the first anode power wires DL1, to connect the anode power connection part DC and the first anode power wires DL1.

In the display panel provided by the embodiments of the present disclosure, the anode power bus DB, the first anode power wires DL1, and the anode power connection part DC may be disposed in layers. A uniformity of the anode power signals in the display panel, may be improved further, and the existing conductive film layers may be utilized effectively at the same time. Extra conductive film layers may be unnecessary, and the light and thin display panel may be achieved.

In some embodiments, as illustrated in FIGS. 2-4, the cathode 24 may be a whole layer structure at least covering all first opening areas OA1 in the pixel definition layer 22, to simplify a formation process of the display panel. When the anode power connection part DC connecting the anode power bus DB to the first anode power wires DL1 may be disposed in a layer same as the anode 21, an orthographic projection of the anode power connection part DC to the pixel definition layer 22 may be limited inside the non-opening areas NO, to make a side of the anode power connection part DC close to the cathode 24 may be insulated from others by the pixel definition layer. The cathode 24 with a whole layer structure may or may not extend from the display region AA to the frame region BA. The cathode 24 with a whole layer structure may only cover all first opening areas OA1 in the pixel definition layer 22. Other functional electrodes may be disposed in a layer same as the cathode 24. In all these cases, a short circuit between the anode power connection part DC and the cathode 24, and a short between the anode power connection part DC and other functional electrodes may be avoided effectively.

In the display panel provided by the embodiments of the present disclosure, the orthographic projection of the anode power connection part DC to the pixel definition layer 22 may be limited inside the non-opening areas NO. A short circuit between the anode power connection part DC and the conductive film layer of the cathode 24 may be avoided effectively, when doing any design with the conductive film layer of the cathode 24. A signal disorder of the anode power signals transmitted to the cathode 24 through the anode power connection part DC may be avoided and reliability of the circuits may be improved. Flexibility of the design with the conductive film layer of the cathode 24 may also be improved.

Figure 5:
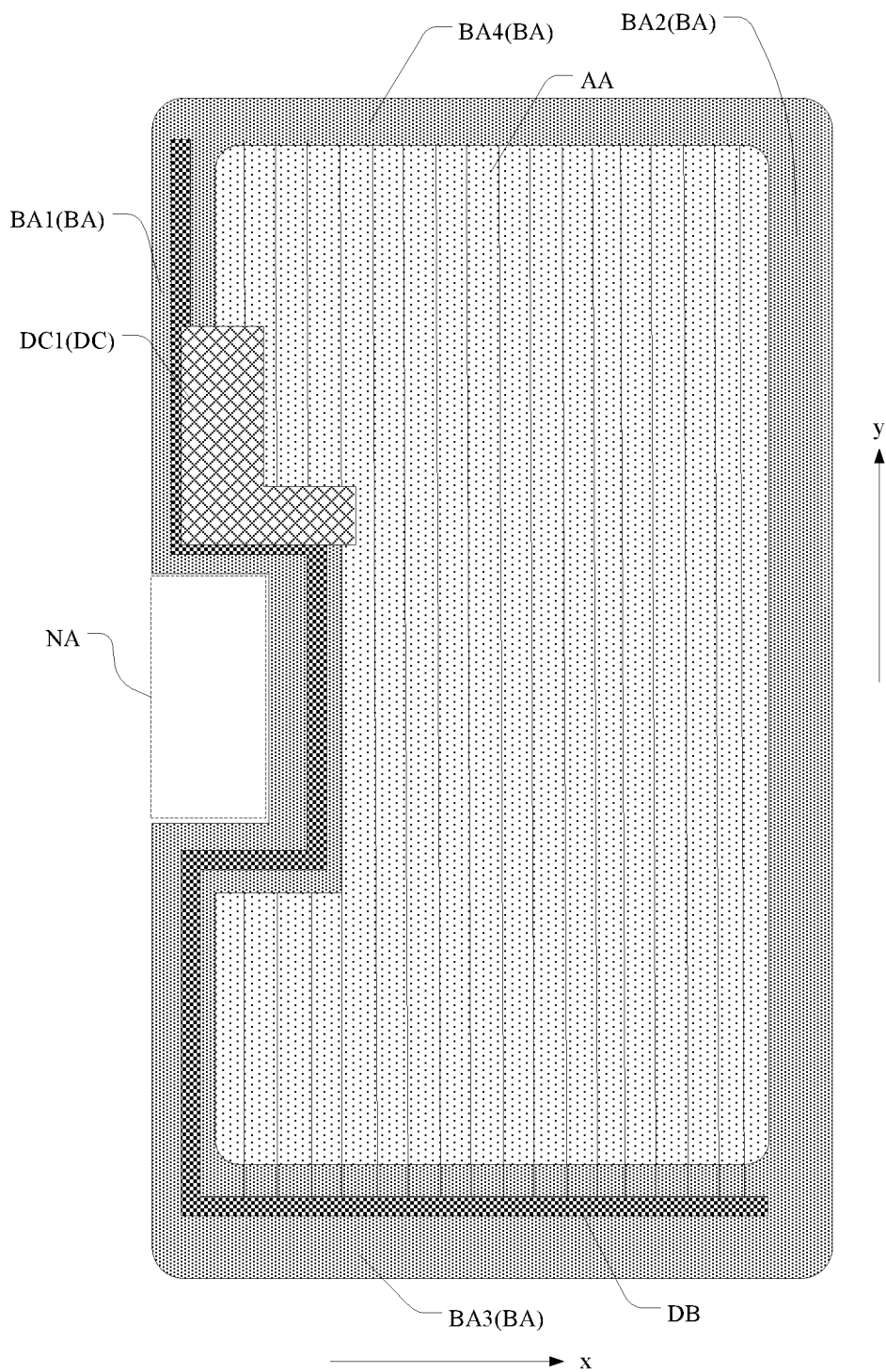
FIG. 5 illustrates another exemplary display panel consistent with various disclosed embodiments in the present disclosure.
Figure 6:
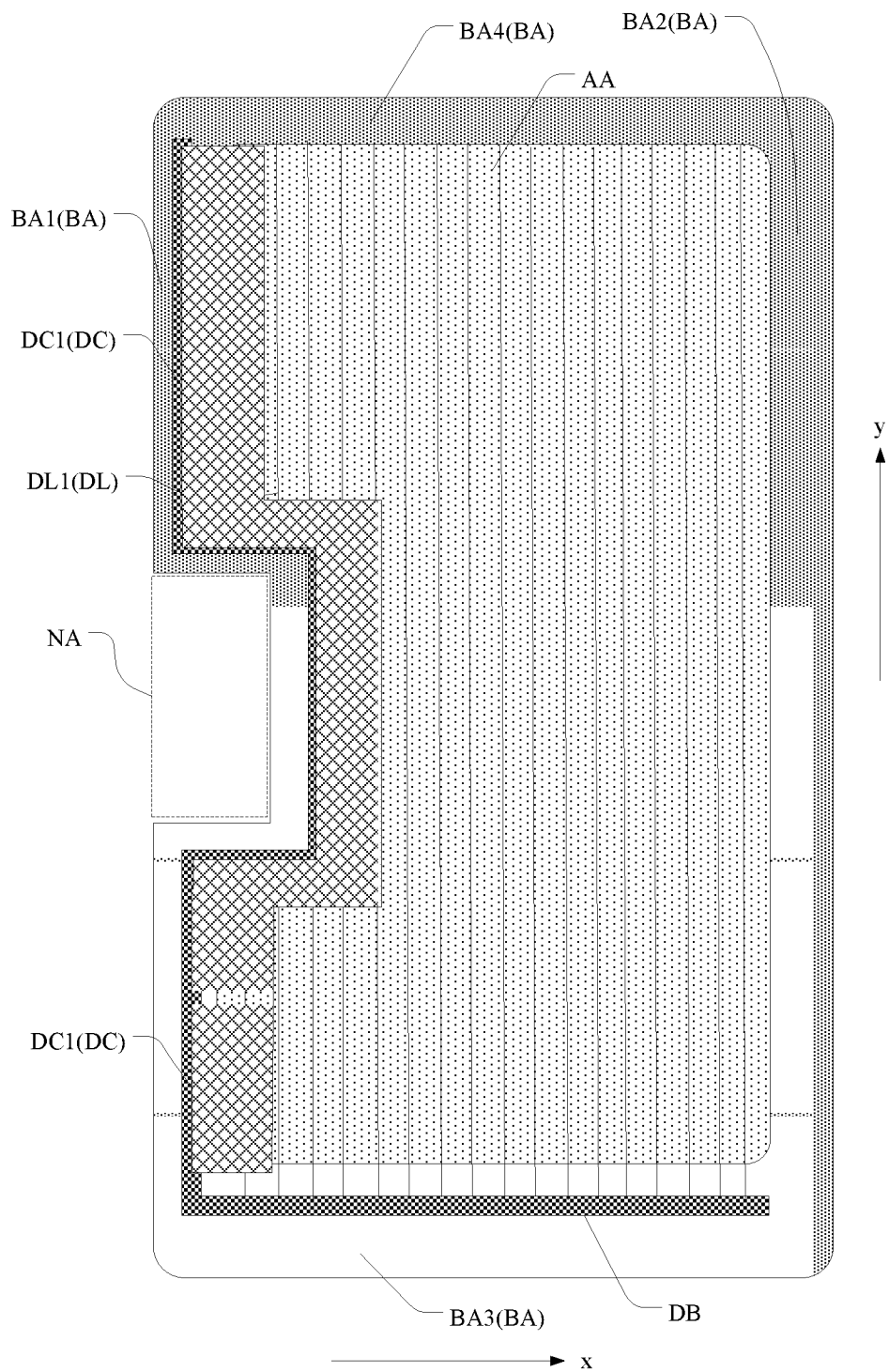
FIG. 6 illustrates another exemplary display panel consistent with various disclosed embodiments in the present disclosure.
Figure 7:
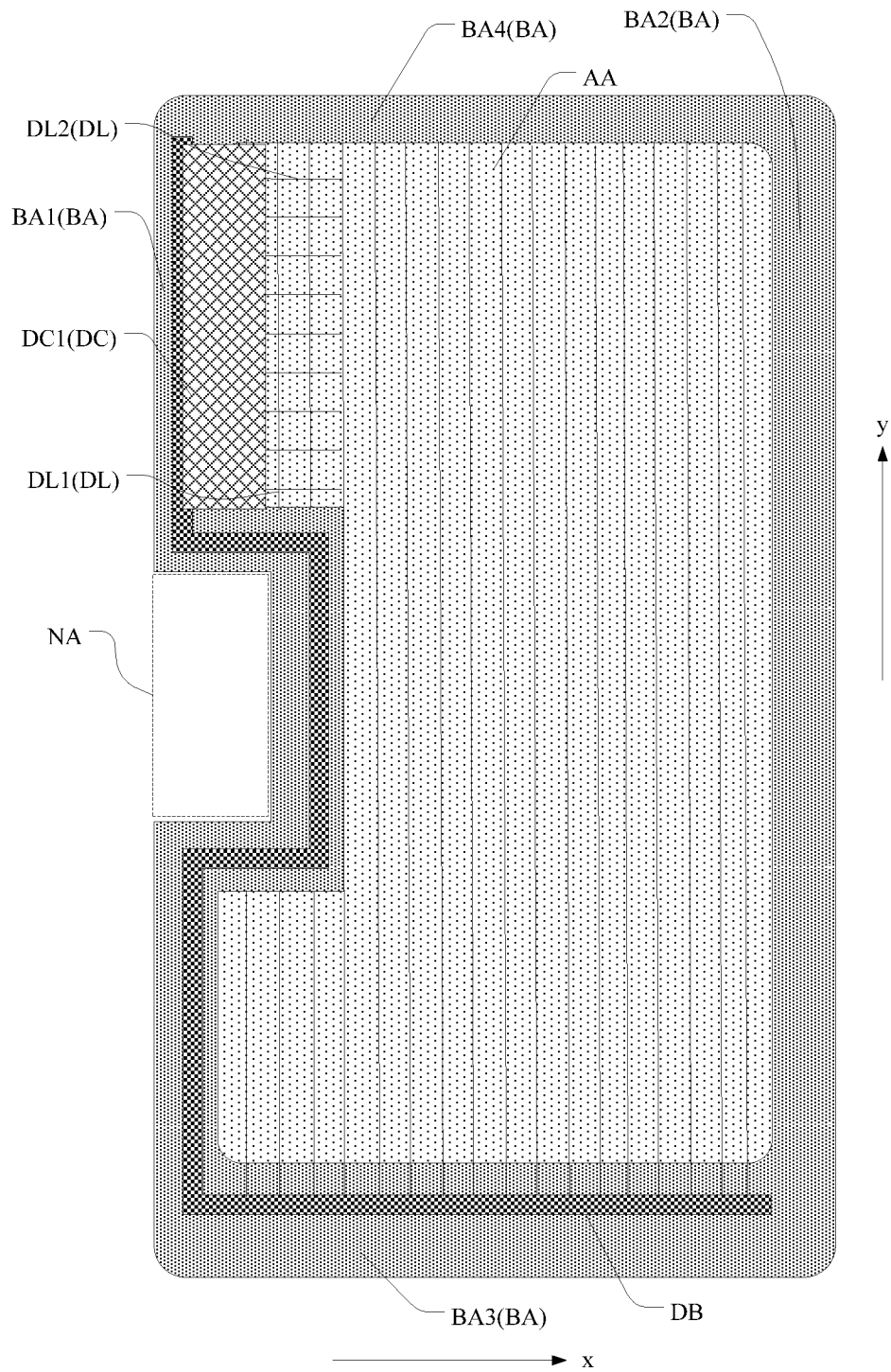
FIG. 7 illustrates another exemplary display panel consistent with various disclosed embodiments in the present disclosure.

In another embodiment illustrated in FIG. 5, the integrated circuit chips (not shown in the figure) may provide the anode power signals to the display panel in the third frame region BA3. The anode power bus DB may be wired from the third frame region BA3 of the first frame region BA1. Each first anode power wire DL1 may be connected to the anode power bus DB in the third frame region BA3. The anode power bus DB and the first anode power connection part DC1 may be disposed at least in a portion of the first frame region BA1, to guarantee a connection between a portion of the first anode power wires DL1 broken in the notch region NA and the anode power bus DB in the first frame region BA1. In another embodiment illustrated in FIG. 6, along the second direction y, the anode power bus DB and the first anode power connection part DC1 may extend from a side of the first frame region BA1 close to the third frame region BA3 to another side of the first frame region BA1 close to the fourth frame region BA4. Channels for signal transmission between the anode power bus DB and the first anode power wires DL1 may be increased. In another embodiment illustrated in FIG. 7, the first anode power connection part DC1 may be disposed in a portion of the first frame region BA1. Among the portion of the first anode power wires DL1 broken in the notch region NA, a first anode power line DL1 adjacent to the first frame region BA1 may be connected to the anode power bus DB through the first anode power connection part DC1. The anode power wires DL may further include second anode power wires DL2 extending along the first direction x. The second anode power wires DL2 may be connected to the portion of the first anode power wires DL1 broken in the notch region NA. Correspondingly, the portion of the first anode power wires DL1 broken in the notch region NA may still receive the anode power signals.

Figure 8:
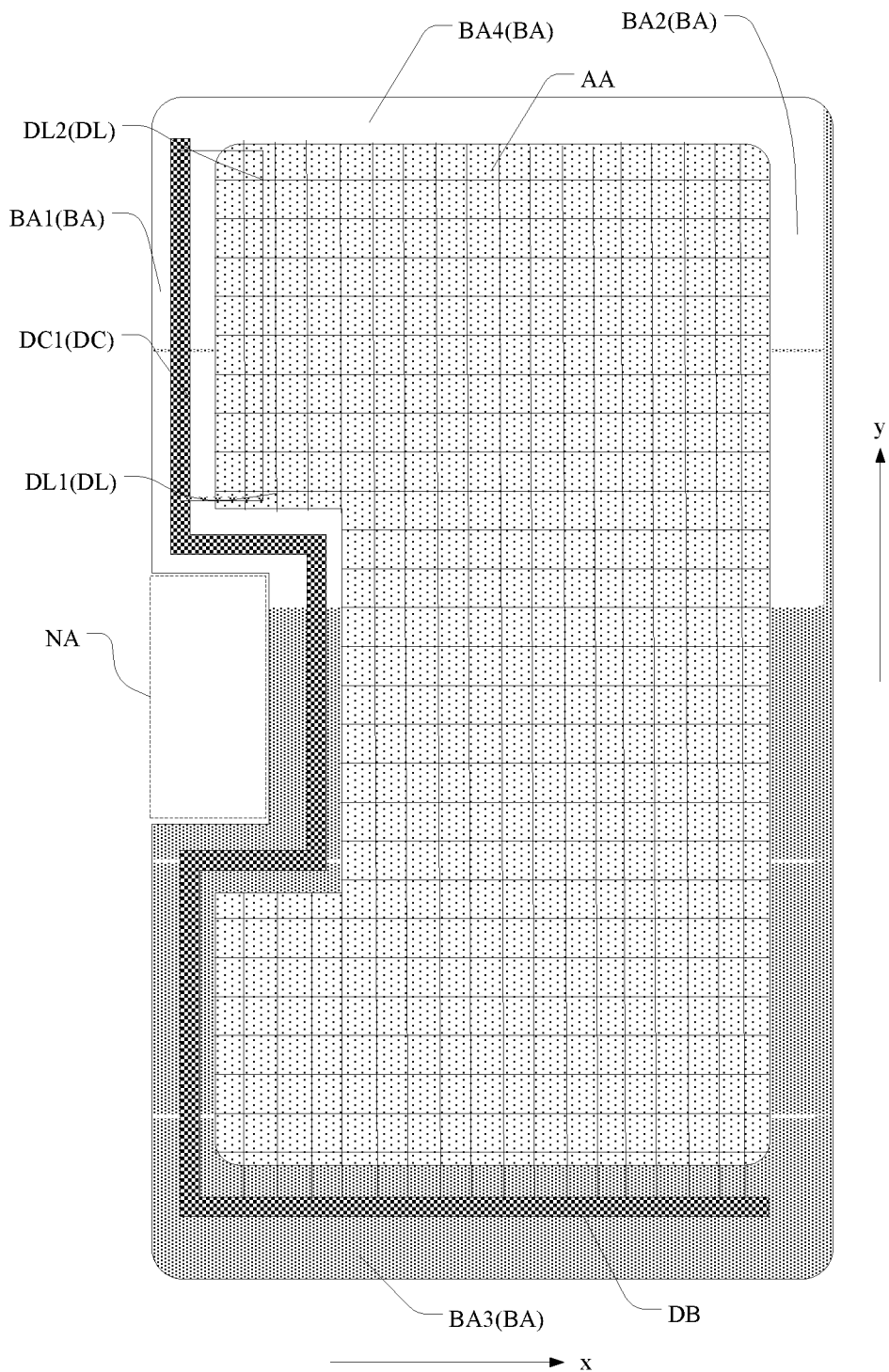
FIG. 8 illustrates another exemplary display panel consistent with various disclosed embodiments in the present disclosure.
Figure 9:
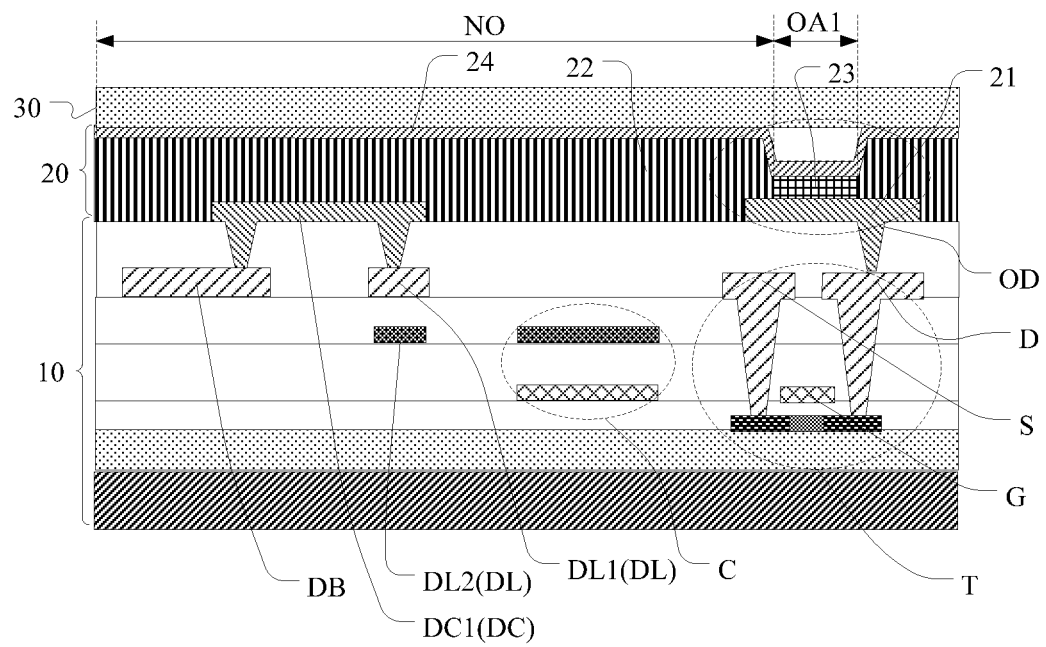
FIG. 9 illustrates a structure of film layers for another exemplary display panel consistent with various disclosed embodiments in the present disclosure.

FIG. 8 illustrates another exemplary display panel and FIG. 9 illustrates a structure of film layers for another exemplary display panel. In an embodiment illustrated in FIGS. 8-9, the first anode power connection part DC1 may be disposed in a portion of the first frame region BA1. Among the portion of the first anode power wires DL1 broken in the notch region NA, a first anode power line DL1 adjacent to the first frame region BA1 may be connected to the anode power bus DB through the first anode power connection part DC1. The anode power wires DL may further include second anode power wires DL2 extending along the first direction x. Each second anode power wire DL2 may be electrically connected to one of the portion of the first anode power wires DL1 broken in the notch region NA, to form a power grid in the display region AA. Uniformity of the anode power signals in the display panel, may be improved further. Along the first direction x, a portion of the power grid close to the notch region NA may receive the anode power signals from the anode power bus DB in the first frame region BA1. A large resistance because of an absence of the power grid in the notch region NA may be balanced.

As illustrated in FIG. 4 and FIG. 9, in a pixel circuit, the holding module M2 may include a storage capacitor C, and a first electrode plate of the storage capacitor C may be disposed in a layer same as the gate G of the driving transistor T. A second electrode plate of the storage capacitor C may be disposed in a film layer between the gate G and the source S of the driving transistor T. The second anode power wires DL2 and the second electrode plate of the storage capacitor C may be disposed in a same layer or a same single layer. In one embodiment, the second anode power wires DL2 may be multiplexed as the second electrode plate of the storage capacitor C. The first anode power wires DL1 and the second anode power wires DL2 may be connected by the through hole.

Figure 10:
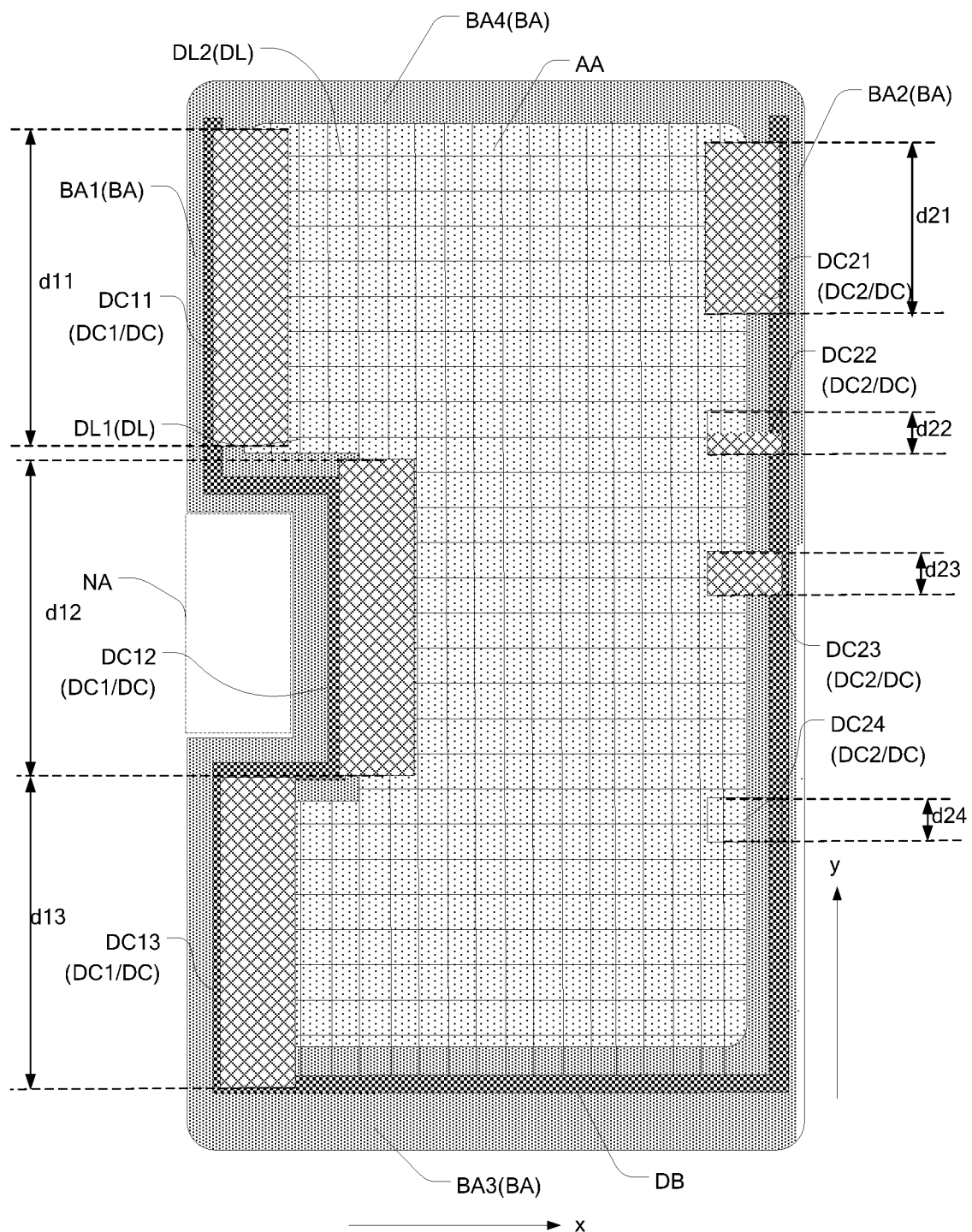
FIG. 10 illustrates another exemplary display panel consistent with various disclosed embodiments in the present disclosure.

FIG. 10 illustrates another exemplary display panel in an embodiment of the present disclosure. In one embodiment illustrated in FIG. 10, the anode power connection part DC may further include a second anode power connection part DC2, and the anode power bus DB may also be formed in the second frame region BA2. The second anode power connection part DC2 may connect the anode power bus DB to the first anode power wires DL1. Channels for transmitting signals between the anode power bus DB and the power grid may be increased and a voltage drop of the signals after the signals arrive the power grid may be reduced further. The first anode power wires DL1 and a first portion of the anode power bus DB in the first frame region BA1, that is the first anode power wires DL1 close to the notch region NA and the anode power bus DB, may have first connection parameters. The first anode power wires DL1 and a second portion of the anode power bus DB in the second frame region BA2, that is the first anode power wires DL1 away from the notch region NA and the anode power bus DB, may have second connection parameters. The connection parameters may include contact areas and/or other parameters. Difference between the first connection parameters and the second connection parameters may be formed, to balance a difference between the resistance of the power grid at two sides of the notch region NA when reducing the voltage drop of the signals after the signals arrive the power grid.

In one embodiment, the first anode power connection part DC1 may have a width d1 and the second node power connection part DC2 may have a width d2, along the second direction y. When the first anode power connection part DC1 has a structure with a plurality of discrete blocks, the width d1 of the first anode power connection part DC1 may be a summation of a length of each of the plurality of discrete blocks. In one embodiment, as illustrated in FIG. 10, the first anode power connection part DC1 may have a structure with three discrete blocks, and may include a first structure DC11, a second structure DC12, and a third structure DC13. Correspondingly, the width d1 of the first anode power connection part DC1 may be a summation of a width d11 of the first block DC11, a width d12 of the second structure DC12 and a width d13 of the third structure DC13 along the second direction y, that is d1=d11+d12+d13. A width d2 of the second anode power connection part DC2 may be defined in a similar way. In one embodiment illustrated in FIG. 10, the second anode power connection part DC2 may have a structure with four discrete blocks, and may include a fourth structure DC21, a fifth structure DC22, a sixth structure DC23, and a fourth structure DC24. Correspondingly, the width d2 of the second anode power connection part DC2 may be a summation of a width d21 of the fourth structure DC21, a width d22 of the fifth structure DC22, a width d23 of the sixth structure DC23, and a width d24 of the fourth structure DC24 along the second direction y, that is d2=d21+d22+d23+d24. In one embodiment, d1 may be larger than d2, while other factors of the first anode power connection part DC1 and the second anode power connection part DC2 which affecting the resistance may be same. Correspondingly, among the channels of the anode power signals transmitted from the anode power bus DB to the first anode power wires DL1, a connection channel between the first anode power wires DL1 and the first portion of the anode power bus DB in the first frame region BA1 may have a width larger than a width of a connection channel between the first anode power wires DL1 and the second portion of the anode power bus DB in the second frame region BA2. A difference between the resistance of the power grid at two sides of the notch region NA may be balanced. The first anode power connection part DC1 may have the width larger than the width of the second anode power connection part DC2. A connection between the first anode power wires DL1 and the first portion of the anode power bus DB in the first frame region BA1 may have a large connection area and a small resistance, while a connection between the first anode power wires DL1 and the second portion of the anode power bus DB in the second frame region BA2 may have a smaller connection area and a larger contact resistance. A difference between the resistance of the power grid at two sides of the notch region NA may be balanced further.

Figure 11:
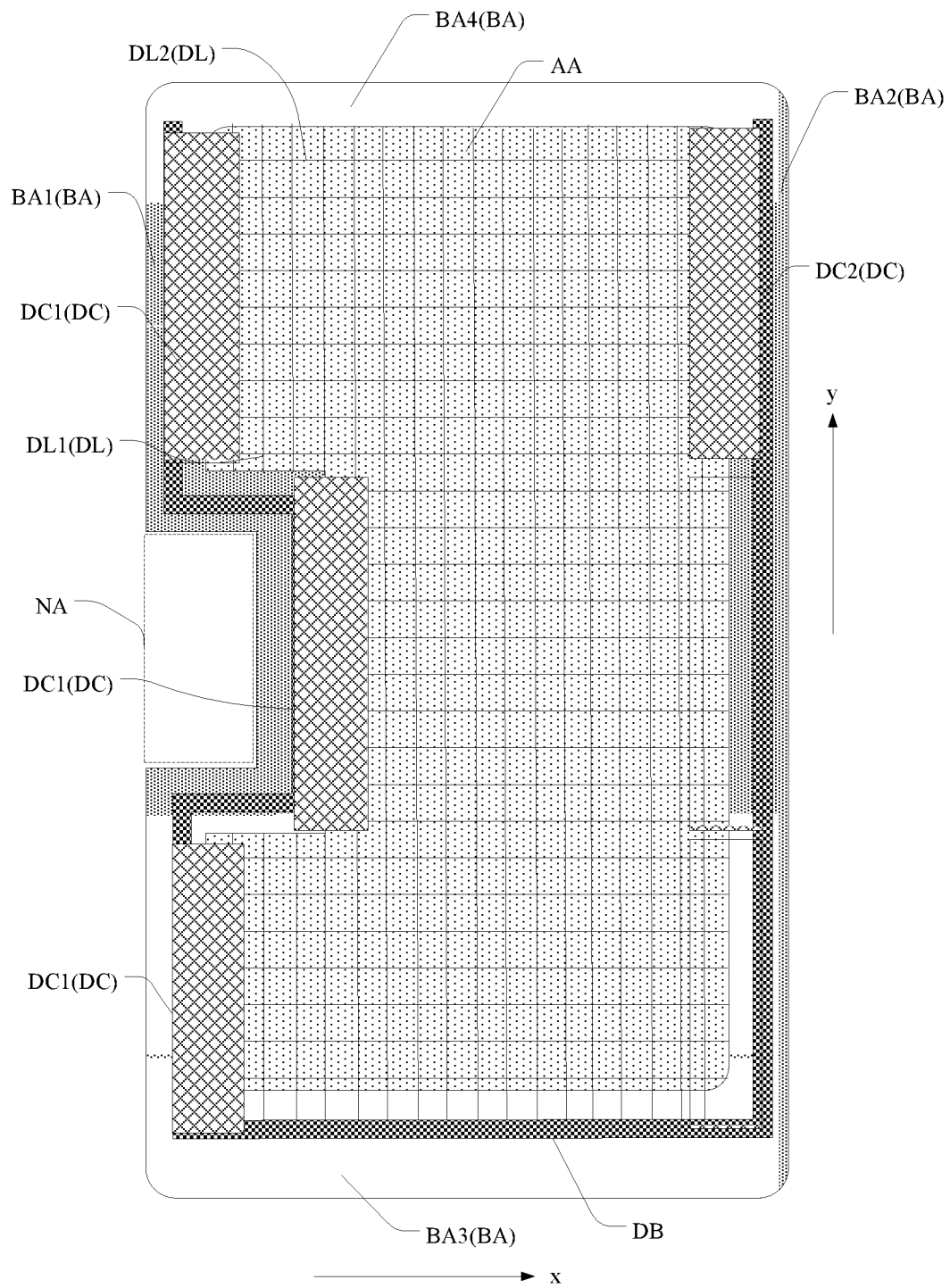
FIG. 11 illustrates another exemplary display panel consistent with various disclosed embodiments in the present disclosure.

FIG. 11 illustrates another exemplary display panel in an embodiment of the present disclosure. In one embodiment illustrated in FIG. 11, along a direction perpendicular to the display panel, the first anode power connection part DC1 and the anode power bus DB may have a first overlapping area S1, while the second anode power connection part DC2 and the anode power bus DB may have a second overlapping area S2. When the first anode power connection part DC1 has a structure with a plurality of discrete blocks, the first overlapping area S1 between the first anode power connection part DC1 and the anode power bus DB may be a summation of an overlapping area between each of the plurality of discrete blocks of the first anode power connection part DC1 and the anode power bus DB. In one embodiment, as illustrated in FIG. 11, the first anode power connection part DC1 may have a structure with three discrete blocks, and the first overlapping area S1 between the first anode power connection part DC1 and the anode power bus DB may be a summation of an overlapping area between each of the three discrete blocks of the first anode power connection part DC1 and the anode power bus DB. The second overlapping area S2 between the second anode power connection part DC2 and the anode power bus DB may be defined in a way similar to the first overlapping area S1. In one embodiment, as illustrated in FIG. 11, the second anode power connection part DC2 may have a structure with three discrete blocks, and the second overlapping area S2 between the second anode power connection part DC2 and the anode power bus DB may be a summation of an overlapping area between each of the three discrete blocks of the second anode power connection part DC2 and the anode power bus DB. In one embodiment, S1 may be larger than S2, while other factors of the first anode power connection part DC1 and the second anode power connection part DC2 which affecting the resistance may be same. Correspondingly, among the channels of the anode power signals transmitted from the anode power bus DB to the first anode power wires DL1, the connection between the first anode power wires DL1 and the first portion of the anode power bus DB in the first frame region BA1 may have a large connection area and a small resistance, while the connection between the first anode power wires DL1 and the second portion of the anode power bus DB in the second frame region BA2 may have a smaller connection area and a larger contact resistance. A difference between the resistance of the power grid at two sides of the notch region NA may be balanced.

Figure 12:
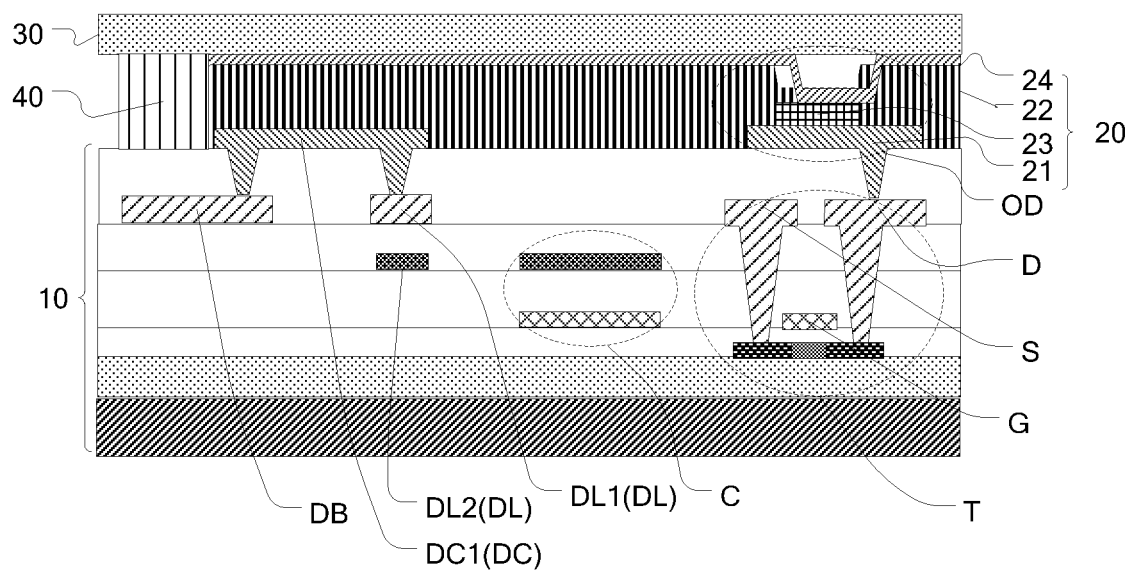
FIG. 12 illustrates a structure of film layers for another exemplary display panel consistent with various disclosed embodiments in the present disclosure.

FIG. 12 illustrates a film layer structure of another exemplary display panel in an embodiment of the present disclosure. In one embodiment illustrated in FIG. 12, the display panel may include a first base plate 10, a second base plate 30 opposite to the first base plate 10, and a light-emitting layer 20 between the second base plate 30 and the first base plate 10. The second base plate 30 may be disposed at one side of the light-emitting layer 20 away from the first base plate 10. The display panel may further include an encapsulation layer 40 between the first base plate 10 and the second base plate 30. The encapsulation layer 40 may bond the first base plate 10 and the second base plate 30, and may package the light-emitting layer 20. When using the encapsulation layer 40, an encapsulation metal may be disposed in a corresponding position along a direction perpendicular to a thickness direction of the display panel. When a laser radiates on the encapsulation layer 40, the laser may arrive at the encapsulation metal through the encapsulation layer 40. The encapsulation metal then may reflect the laser back to the encapsulation layer 40. When the laser passes through the encapsulation layer 40 twice, the laser may melt the encapsulation layer 40 to achieve packaging. An orthographic projection of the encapsulation layer 40 to the first base plate 10 may at least partially overlap the anode power bus DB, and correspondingly an orthographic projection of the encapsulation metal to the first base plate 10 may at least partially overlap the anode power bus DB. In some other embodiments, the anode power bus DB may be used as the encapsulation metal at a same time to reflect the laser. Correspondingly, the anode power bus DB may not occupy extra spaces of the frame. A width of the frame region may be reduced, and a narrow frame may be achieved.

Figure 13:
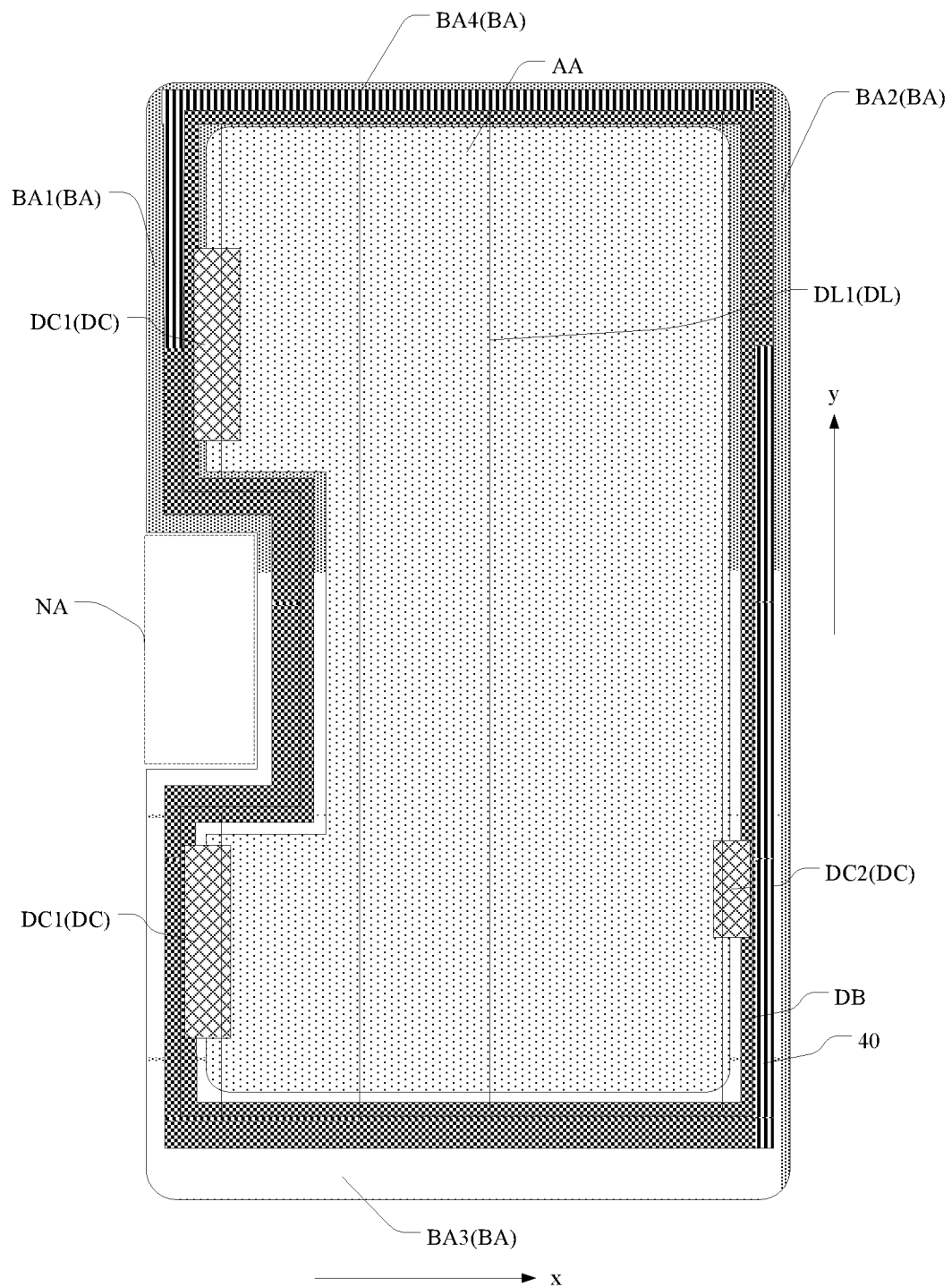
FIG. 13 illustrates another exemplary display panel consistent with various disclosed embodiments in the present disclosure.

FIG. 13 illustrates a film layer structure of another exemplary display panel in an embodiment of the present disclosure. In one embodiment illustrated in FIG. 13, the anode power bus DB may be disposed in the frame region BA to surround the display region AA. Correspondingly, the first anode power wires DL1 can be connected to the anode power bus at any position of the frame region BA. The voltage drop of the anode power signals transmitted from the anode power bus DB to the first anode power wires DL1 may be reduced further. For description purposes only, only a portion of the anode power wires DL is shown in FIG. 13, and it should not limit the scopes of the present disclosure. A portion of the orthographic projection of the encapsulation layer 40 to the first base plate 10 overlapping the anode power bus DB may form a closed pattern surrounding the display region AA. A width of the frame region at any position of the frame region may be reduced.

Further, in another embodiment illustrated in FIGS. 12-13, along the direction perpendicular to the display panel, the first anode power connection part DC1 may partially cover the anode power bus DB, while a portion of the anode power bus DB which is not covered by the first anode power connection part DC1 may be multiplexed as the encapsulation metal. If the anode power bus DB surrounds the display region AA and the portion of the anode power bus DB which is not covered by the first anode power connection part DC1 may be multiplexed as the encapsulation metal, along any direction surrounding the display region AA, a space for accommodating the encapsulation metal specifically may be reduced or avoided. A narrow frame may be achieved.

In another embodiment illustrated in FIG. 13, the orthographic projection of the encapsulation layer 40 to the first base plate 10 may not overlap the anode power bus DB. Correspondingly, the laser transmitting through the encapsulation layer 40 may not arrive at the anode power connection part DC. The anode power connection part DC may not be used as the encapsulation metal at the same time. If the anode power bus DB and the anode power connection part DC are both used as the encapsulation metal at the same time, a reflection of the laser on the anode power bus DB and the anode power connection part DC would produce a light path difference, and different portions of the encapsulation layer 40 corresponding to the anode power bus DB and the anode power connection part DC may be melted differently. A package effect may be reduced. In the embodiments of the present disclosure, the anode power connection part DC may not be used as the encapsulation metal and only the anode power bus DB may be used as the encapsulation metal at a same time, a light path of the laser from any position to the encapsulation metal may be consistent in the packaging process. A package effect may be improved.

Figure 14:
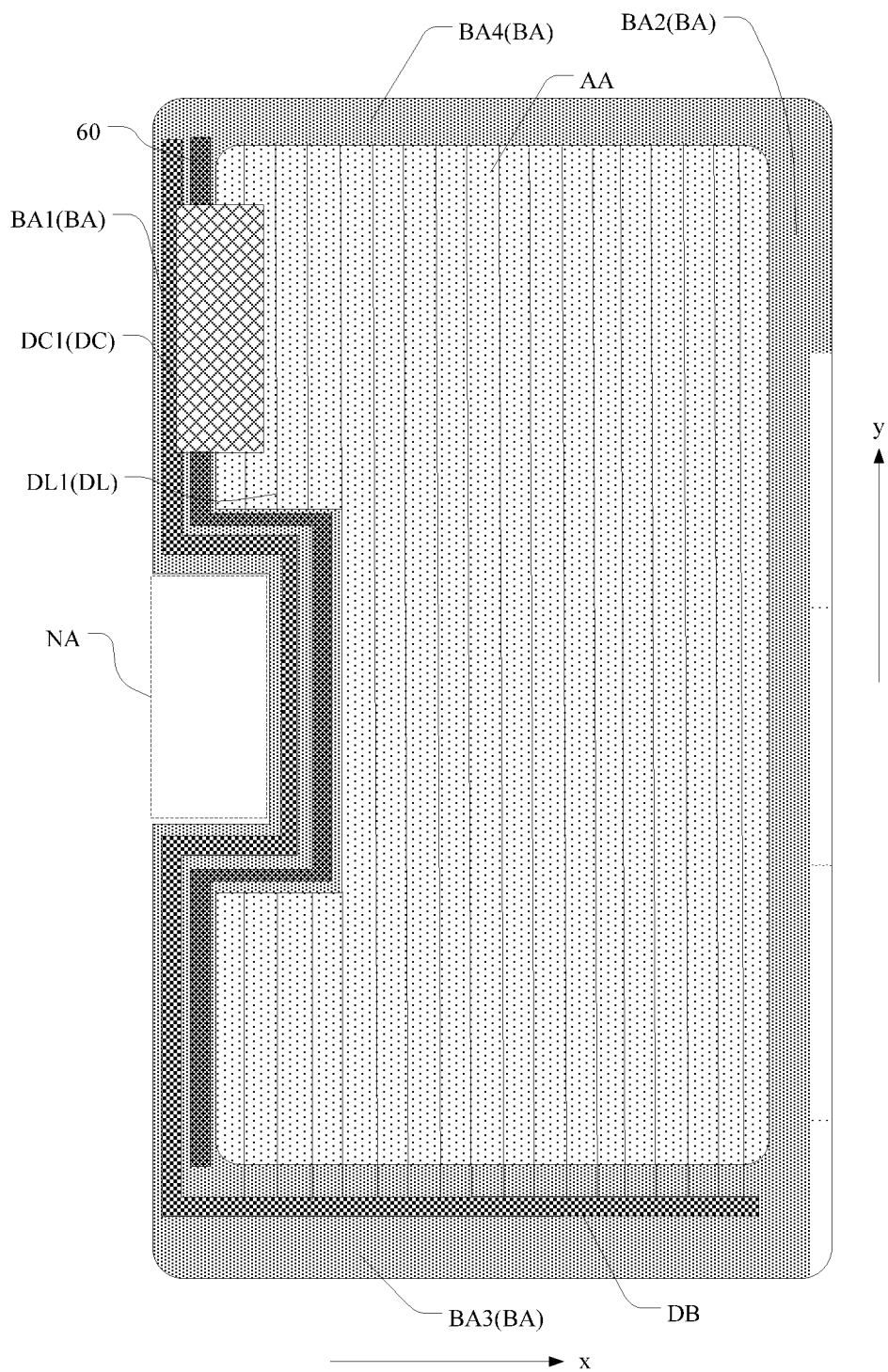
FIG. 14 illustrates another exemplary display panel consistent with various disclosed embodiments in the present disclosure.

FIG. 14 illustrates another exemplary display panel in an embodiment of the present disclosure. In one embodiment illustrated in FIG. 14, the first base plate may further include a driving circuit 60. At least a portion of the driving circuit 60 may be disposed in the first frame region BA1. Along the direction perpendicular to the display panel, the driving circuit 60 and the anode power connection part DC may overlap at least partially. A width of the first frame region BA1 may be reduced. The driving circuit 60 may be a scanning driving circuit, to provide scanning driving signals to scanning wires. Along the second direction y, the driving circuit 60 may be disposed in a portion of the first frame region BA1, or the driving circuit 60 may be disposed in any position of the first frame region BA1. The driving circuit 60 may be also disposed in the second frame region BA2. The architecture of the driving circuit may be designed flexibly according to actual needs. The driving circuit 60 may include a plurality of thin film transistors. The anode power bus DB and the first anode power wires DL1 may be disposed in a layer same as the sources/drains of the thin film transistors. When the anode power connection part DC and the anode are disposed in a same single layer, the driving circuit 60 and the anode power connection part DC may be disposed alternately along the direction perpendicular to the display panel. The width of the frame region BA may be reduced, and the anode power connection part DC may have no influence on the disposing position of the driving circuit 60.

Figure 15:
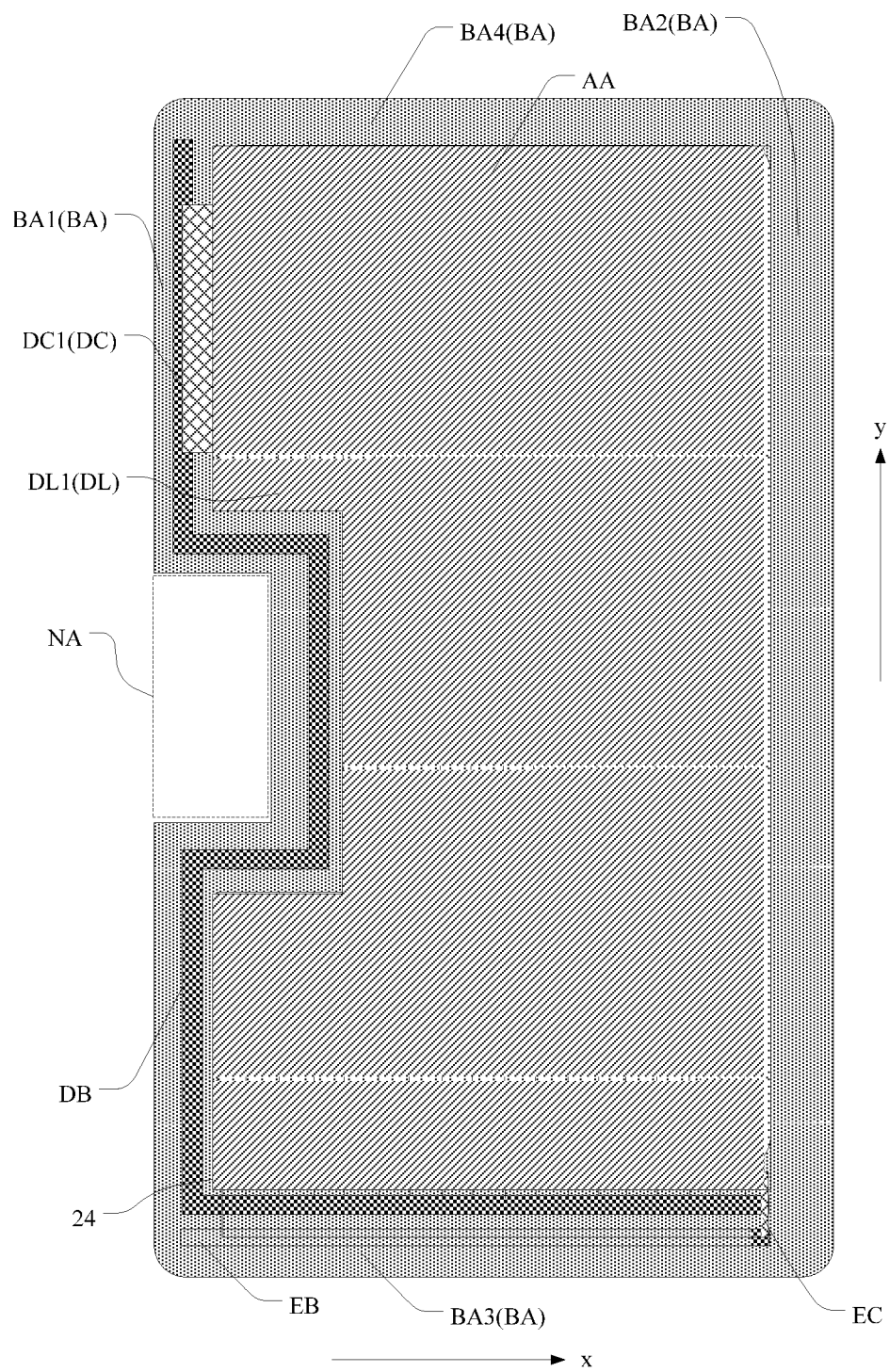
FIG. 15 illustrates another exemplary display panel consistent with various disclosed embodiments in the present disclosure.

FIG. 15 illustrates another exemplary display panel in an embodiment of the present disclosure. In one embodiment illustrated in FIG. 15, the first base plate 10 may further include a cathode power bus EB and a cathode power connection part EC. The cathode power bus EB may be disposed in the third frame region BA3, and the cathode power connection part EC may connect the cathode power bus EB to the cathode 24.

In the present disclosure, the cathode power bus EB may be disposed only in the third frame region BA3, and may be connected to the cathode 24 by the cathode power connection part EC. The formed display panel may have a narrow frame.

Figure 16:
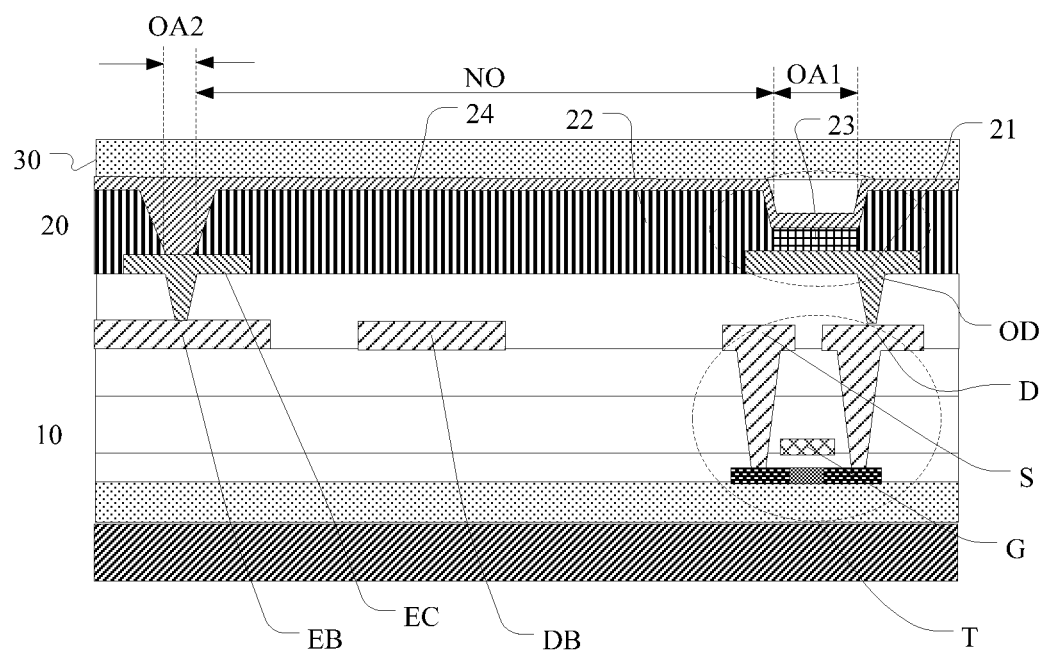
FIG. 16 illustrates a structure of film layers for another exemplary display panel consistent with various disclosed embodiments in the present disclosure.

FIG. 16 illustrates a film layer structure of another exemplary display panel in an embodiment of the present disclosure. In one embodiment illustrated in FIGS. 15-16, the cathode power bus EB may be disposed at a side of the anode power bus DB away from the display region AA. The cathode power bus EB and the anode power bus DB may be disposed in a same single layer. The cathode power connection part EC and the anode 21 may be disposed in a same single layer.

In the present disclosure, in the third frame region, the anode power bus DB may be directly connected to the anode. Correspondingly, the cathode power bus may be connected to the cathode through the cathode power connection part in a layer same as the anode. The width of the third frame region may be reduced.

In another embodiment illustrated in FIGS. 15-16, the pixel definition layer 22 may include second opening areas OA2. The second opening areas OA2 may expose the cathode power connection part EC. The cathode power connection part EC may be connected to the cathode power bus EB by the through holes. The cathode power connection part EC and the cathode 24 may contact each other directly in the second opening areas OA2. Cathode power signals may be transmitted from the cathode power bus EB to the cathode 24 through the cathode power connection part EC.

In the present disclosure, the cathode power connection part EC may be connected to the cathode 24 through the second opening areas in the pixel definition layer. The second opening areas may be formed in a same process for forming the first opening areas accommodating the light-emitting material. A process for forming the display panel may be simplified.

The present disclosure also provides a display device. The display device may include any display panel provided by various embodiments of the present disclosure.

Figure 17:
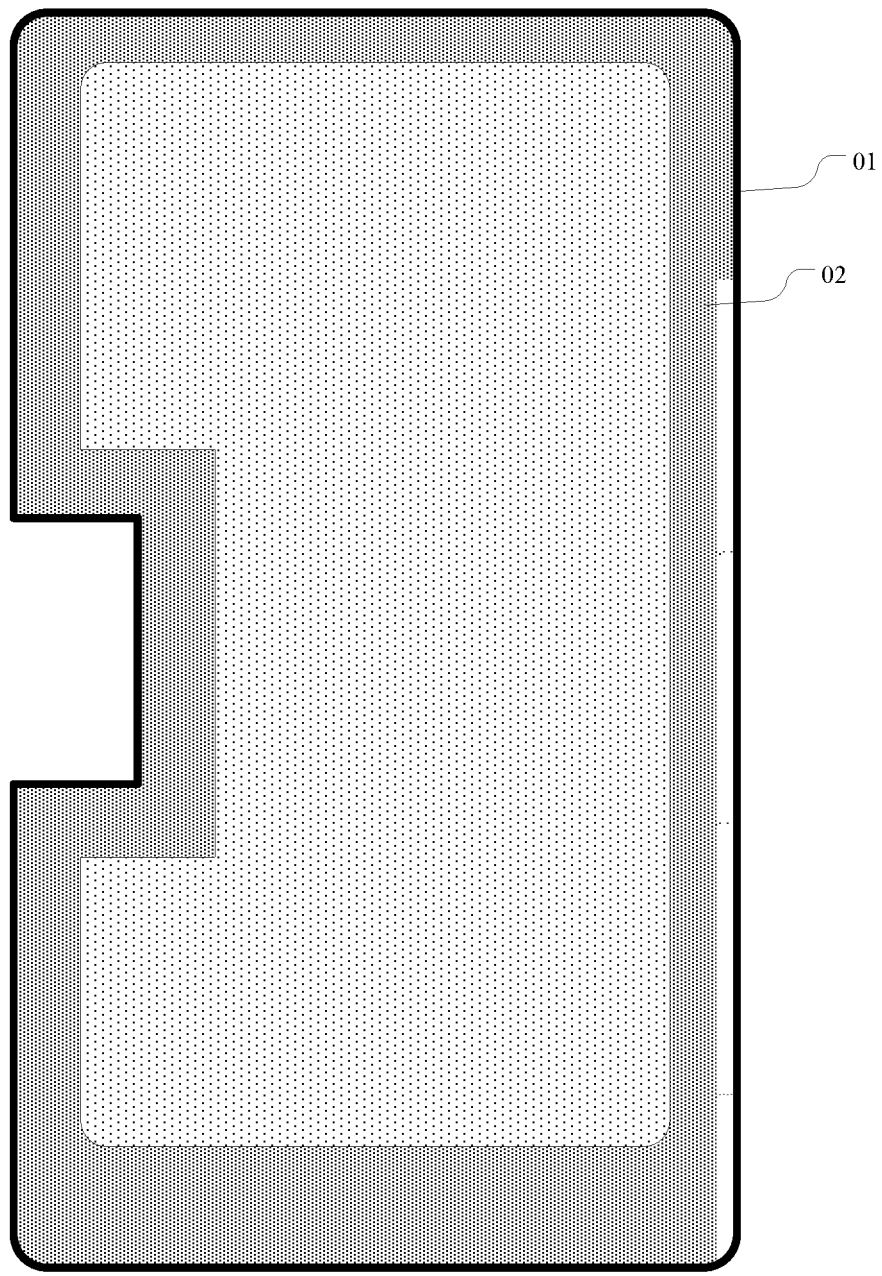
FIG. 17 illustrates an exemplary display device consistent with various disclosed embodiments in the present disclosure.

In one embodiment illustrated in FIG. 17, the display device may include a shell 01 and a display panel 02. The display panel 02 may be any display panel provided by various embodiments of the present disclosure.

In the display panel and display device provided by various embodiments of the present disclosure, the notch region may be formed at an edge at a side of the display panel. A portion of the first anode power wires may break at the notch region. The anode power bus may be disposed at the side of the frame region close to the notch region, and a path by which the portion of the first anode power wires at the side of the display panel close to the notch region receives the anode power signals may be reduced. Then the voltage drop of the anode power signals transmitted from the anode power bus to the anode power wires. A large resistance of the portion of the first anode power wires at the side of the display panel close to the notch region due to the broken of the first anode power wires at the notch region may be balanced. A difference between the voltage drop of the anode power signals at the side of the display panel close to the notch region and the voltage drop of the anode power signals at the other side of the display panel opposite to the notch region may be alleviated. Uniformity of the anode power signals n the display panel and uniformity of the display of the light-emitting devices in the display panel, may be improved. Display performance of the display panel may be improved then.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
a notch region, a display region, and a first base plate; wherein:
the frame region includes a first frame region and a second frame region opposite to the first frame region along a first direction; and
a portion of the first frame region recesses toward the display region to form the notch region;
the first base plate includes an anode power bus, an anode power connection part, and a plurality of anode power wires;
the plurality of anode power wires is disposed in the display region and includes first anode power wires extending along a second direction perpendicular to the first direction;
at least a portion of the anode power bus is disposed in the first frame region; and
the anode power connection part includes at least a first anode power connection part connecting the anode power bus to the first anode power wires;
wherein the display panel further includes including a light-emitting layer, wherein:
the light-emitting layer includes an anode, a pixel definition layer, a light-emitting material, and a cathode;
the anode is disposed at a side of the first base plate;
the pixel definition layer is disposed at a side of the anode away from the first base plate;
the pixel definition layer includes a first opening area and a non-opening area;
the first opening area exposes the anode;
the light-emitting material is disposed in the first opening area;
the cathode is disposed at a side of the light-emitting material and the pixel definition layer away from the anode;
the first base plate includes thin film transistors and storage capacitors;
each of the thin film transistor includes a gate, a source, and a drain;
the anode power bus, the first anode power wires, the sources, and the drains of the thin film transistors, are disposed in a same single layer;
the anode power connection part and the anodes are disposed in a same single layer;
the plurality of anode power wires further includes second anode power wires extending along the first direction;
the second anode power wires and a second plate of the storage capacitor are disposed in a same single layer; and
the second anode power wires are electrically connected to the first anode power wires.

2. The display panel according to claim 1, wherein along a direction perpendicular to a plane of the display panel the anode power connection part overlaps the non-opening area.

3. The display panel according to claim 1, wherein:
the first base plate further includes a driving circuit;
at least a portion of the driving circuit is disposed in the first frame region; and
along the direction perpendicular to the display panel, the driving circuit at least partially overlaps the anode power connection part.

4. The display panel according to claim 1, wherein:
the frame region further includes a third frame region between and connecting the first frame region and the second frame region; and
the first base plate further includes a cathode power bus in the third frame region and a cathode power connection part connecting the cathode power bus to the cathode.

5. The display panel according to claim 4, wherein:
the cathode power bus is disposed at a side of the anode power bus away from the display region;
the cathode power bus and the anode power bus are disposed in a same single layer; and
the cathode power connection part and the anode are disposed in a same single layer.

6. The display panel according to claim 5, wherein:
the pixel definition layer further includes a second opening area;
the second opening area exposes the cathode power connection part; and
the cathode power connection part is in a direct contact with the cathode.

7. The display panel according to claim 1, further including:
a second base plate, disposed at a side of the light-emitting layer away from the first base plate; and
an encapsulation layer, disposed between the first base plate and the second base plate;
wherein:
along a direction perpendicular to a plane of the display panel the encapsulation layer on the first base plate at least partially overlaps the anode power bus.

8. The display panel according to claim 7, wherein:
the anode power bus is disposed in the frame region and surrounds the display region; and
along the direction perpendicular to the plane of the display panel, a portion of the encapsulation layer overlapping the anode power bus forms a closed shape surrounding the display region.

9. The display panel according to claim 7, wherein:
along the direction perpendicular to the plane of the display panel, the first anode power connection part partially covers the anode power bus; and
a portion of the anode power bus which is uncovered by the first anode power connection part is multiplexed as an encapsulation metal.

10. The display panel according to claim 9, wherein along the direction perpendicular to the plane of the display panel the encapsulation layer does not overlap the anode power connection part.

11. A display panel, comprising:
a notch region, a display region, a frame region surrounding the display region, a first base plate, and a light-emitting layer; wherein:
the frame region includes a first frame region and a second frame region opposite to the first frame region along a first direction;
a portion of the first frame region recesses toward the display region to form the notch region;
the first base plate includes an anode power bus, an anode power connection part, and a plurality of anode power wires;
the plurality of anode power wires is disposed in the display region and includes first anode power wires extending along a second direction perpendicular to the first direction;
at least a portion of the anode power bus is disposed in the first frame region;
the anode power connection part includes at least a first anode power connection part connecting the anode power bus to the first anode power wires;
the light-emitting layer includes an anode, a pixel definition layer, a light-emitting material, and a cathode;
the anode is disposed at a side of the first base plate;
the pixel definition layer is disposed at a side of the anode away from the first base plate;
the pixel definition layer includes a first opening area and a non-opening area;
the first opening area exposes the anode;
the light-emitting material is disposed in the first opening area;
the cathode is disposed at a side of the light-emitting material and the pixel definition layer away from the anode;
the first base plate includes thin film transistors and storage capacitors;
each of the thin film transistor includes a gate, a source, and a drain;
the anode power bus, the first anode power wires, the sources, and the drains of the thin film transistors, are disposed in a same single layer; and
the anode power connection part and the anodes are disposed in a same single layer,
wherein:
the anode power connection part further includes a second anode power connection part;
a portion of the anode power bus is disposed in the second frame region; and
the second anode power connection part connects the anode power bus to the first anode power wires.

12. The display panel according to claim 11, wherein:
along the second direction, the first anode power connection part has a width d1 and the second anode power connection part has a width d2; and
d1 is larger than d2.

13. The display panel according to claim 11, wherein:
along a direction perpendicular to the display panel, an overlap between the first power connection part and the anode power bus has an area S1, and an overlap between the second power connection part and the anode power bus has an area S2; and
S1 is larger than S2.

14. A display device, comprising:
a display panel, including:
a notch region, a display region, a frame region surrounding the display region, and a first base plate; wherein:
the frame region includes a first frame region and a second frame region opposite to the first frame region along a first direction; and
a portion of the first frame region recesses toward the display region to form the notch region;
the first base plate includes an anode power bus, an anode power connection part, and a plurality of anode power wires;
the plurality of anode power wires is disposed in the display region and includes first anode power wires extending along a second direction perpendicular to the first direction;
at least a portion of the anode power bus is disposed in the first frame region; and
the anode power connection part includes at least a first anode power connection part connecting the anode power bus to the first anode power wires,
wherein the display panel further includes a light-emitting layer, wherein:
the light-emitting layer includes an anode, a pixel definition layer, a light-emitting material, and a cathode;
the anode is disposed at a side of the first base plate;
the pixel definition layer is disposed at a side of the anode away from the first base plate;
the pixel definition layer includes a first opening area and a non-opening area;
the first opening area exposes the anode;
the light-emitting material is disposed in the first opening area;
the cathode is disposed at a side of the light-emitting material and the pixel definition layer away from the anode;
the first base plate includes thin film transistors and storage capacitors;
each of the thin film transistor includes a gate, a source, and a drain;
the anode power bus, the first anode power wires, the sources, and the drains of the thin film transistors, are disposed in a same single layer;
the anode power connection part and the anodes are disposed in a same single layer;
the plurality of anode power wires further includes second anode power wires extending along the first direction;
the second anode power wires and a second plate of the storage capacitor are disposed in a same single layer; and
the second anode power wires are electrically connected to the first anode power wires.

* * * * *